United States Patent
Sparks et al.

[11] Patent Number: 6,062,461
[45] Date of Patent: May 16, 2000

[54] PROCESS FOR BONDING MICROMACHINED WAFERS USING SOLDER

[75] Inventors: Douglas Ray Sparks; Larry Lee Jordan, both of Kokomo; Ruth Ellen Beni, Carmel; Anthony Alan Duffer; Shing Yeh, both of Kokomo, all of Ind.

[73] Assignee: Delphi Technologies, Inc., Troy, Mich.

[21] Appl. No.: 09/116,815

[22] Filed: Jun. 3, 1998

[51] Int. Cl.⁷ .................................................. H01L 21/50
[52] U.S. Cl. ........................... 228/123.1; 228/124.6; 228/174; 228/208
[58] Field of Search ........................... 228/122.1, 123.1, 228/124.6, 174, 208

[56] References Cited

U.S. PATENT DOCUMENTS

| | | | |
|---|---|---|---|
| 3,777,281 | 12/1973 | Hochuli | 372/107 |
| 4,558,346 | 12/1985 | Kida et al. | 228/124.6 |
| 4,769,272 | 9/1988 | Byrne et al. | 228/124.6 |
| 5,156,322 | 10/1992 | Do-Thoi et al. | 228/124.1 |
| 5,361,967 | 11/1994 | Anderson et al. | 228/124.6 |
| 5,490,628 | 2/1996 | Beatty | 228/124.6 |
| 5,547,093 | 8/1996 | Sparks et al. | 216/2 |
| 5,573,171 | 11/1996 | Kong et al. | 228/123.1 |
| 5,577,656 | 11/1996 | Temple et al. | 228/123.1 |
| 5,831,162 | 11/1998 | Sparks et al. | 73/504.12 |

OTHER PUBLICATIONS

W. Ko et al.; "Micromachining and Micropackaging of Transducers", Elsevier Science Publishers B.V., Amsterdam, pp. 41–61, 1985.

Guide to Indalloy Specialty Alloys, p. 12 from brochure.
CRC Handbook of Physics and Chemistry, "Brazing Filler Metals (Solders)", p. F–137, 1981.
D. Sparks et al.; Flexible vacuum–packaging method for resonating micromachines,: Sensors and Actuators, A55, p. 179, 1996.
D. Sparks et al. A"A CMOS Integrated Surface Micromachined Angular Rate Sensor: It's Automotive Applications," Transducers '97,p. 851, 1997.

*Primary Examiner*—Samuel M. Heinrich
*Attorney, Agent, or Firm*—Jimmy L. Funke

[57] ABSTRACT

A method by which semiconductor wafers (10, 12) can be solder bonded to form a semiconductor device, such as a sensor with a micromachined structure (14). The method entails forming a solderable ring (18) on the mating surface of a device wafer (10), such that the solderable ring (18) circumscribes the micromachine (14) on the wafer (10). A solderable layer (20, 26, 28) is formed on a capping wafer (12), such that at least the mating surface (24) of the capping wafer (12) is entirely covered by the solderable layer (20, 26, 28). The solderable layer (20, 26, 28) can be formed by etching the mating surface (24) of the capping wafer (12) to form a recess (16) circumscribed by the mating surface (24), and then forming the solderable layer (26) to cover the mating surface (24) and the recess (16) of the capping wafer (12). Alternatively, the solderable layer (28) can be formed by depositing a solderable material to cover the entire lower surface of the capping wafer (12), patterning the resulting solderable layer (28) to form an etch mask on the capping wafer (12), and then to form the recess (16), such that the solderable layer (28) covers the mating surface (24) but not the surfaces of the recess (16).

17 Claims, 1 Drawing Sheet

PROCESS FOR BONDING MICROMACHINED WAFERS USING SOLDER

FIELD OF THE INVENTION

The present invention generally relates to methods for bonding silicon wafers. More particularly, this invention relates to a wafer bonding process for hermetically bonding silicon wafers together with solder, wherein the bonding process is capable of relaxing wafer alignment tolerances and being conducted at sufficiently low temperatures to avoid negatively affecting the sensitivity of a sensor formed by the bonded wafers.

BACKGROUND OF THE INVENTION

Within the semiconductor industry, there are numerous applications that require bonding two or more semiconductor wafers together, an example being semiconductor sensors formed by a silicon wafer (referred to herein as a device wafer) with a micromachined structure or micromachine, which is capped by a second wafer (referred to herein as a capping wafer). Specific examples of semiconductor sensors include yaw (angular rate) sensors, accelerometers and pressure sensors, each of which typically entails a cavity formed in the capping wafer to receive and/or provide clearance for the micromachine of the device wafer. Absolute pressure sensors require that the cavity be evacuated and hermetically sealed, while the performance of yaw sensors and accelerometers with resonating and tunneling micromachines generally benefit if the cavity is evacuated so that the micromachine operates in a vacuum.

The integrity of the bond between the wafers is essential for promoting the life of a semiconductor sensing device. As a result, various bonding techniques have been suggested for the purpose of maximizing the strength and reliability of the bond. For example, the use of adhesives, dielectrics such as glass frit, and solders as intermediate bonding materials have all been suggested in the prior art. Silicon direct and anodic bonding techniques that do not require an intermediate material have also been used. As can be expected, each of these bonding techniques can be incompatible or less than ideal for certain applications. An example of particular interest here is the manufacture of resonating and tunneling micromachines that require a vacuum for improved performance. Silicon direct and anodic bonding methods require very smooth bonding surfaces, and therefore cannot produce a vacuum seal when unplanarized metal crossunders are employed, as is often required to electrically interconnect resonating and tunneling micromachines to bond pads outside the vacuum-sealed cavity of a sensor. In contrast, organic adhesives, glass frit and solder can be used to cover metal steps of up to 21,000 Å found on CMOS, bipolar and BICMOS wafers. However, organic adhesives have not been found to reliably seal micromachines under vacuum, and bonding techniques employing glass frit require temperatures typically in the range of about 385° C. to 410° C., which can cause polysilicon, electroformed metal and LIGA micromachines to warp, bend and/or become electrically unstable. As a further example, yaw sensors with resonating micromachined structures are prone to exhibit zero offset drift, compass effect and start-up drift if subjected to the temperatures necessary to bond wafers with glass frit.

In contrast, solder wafer bonds can be formed at temperatures of 350° C. and less, and have been successfully used to form vacuum seals between wafers having a micromachined structure, as disclosed in U.S. patent application Ser. No. 08/785,683 to Sparks et al., assigned to the assignee of the present invention. Because solder alloys cannot wet or bond to semiconductor materials such as silicon and ceramics, solder wafer bonding requires solderable bond pads adhered to each wafer and to which the solder will metallurgically bond. As shown in Sparks et al., solder bonding of two wafers to form an evacuated cavity requires a pair of complementary solderable rings on the device and capping wafers. A drawback to this requirement is the close alignment tolerances required to align the solderable rings, which complicates the bonding process when performed in a vacuum to obtain an evacuated cavity for housing the micromachine.

From the above, it can be appreciated that improved bonding processes are desired to form a semiconductor sensor having a micromachined structure enclosed in an evacuated cavity and metal crossunders interconnecting the micromachine to bond pads outside of the cavity.

SUMMARY OF THE INVENTION

It is an object of this invention to provide a method for bonding two or more semiconductor wafers together so as to form a bond that can maintain a vacuum within a cavity formed between the wafers.

It is another object of this invention that such a method is a solder bonding technique that can be performed at temperatures sufficiently low to avoid thermal damage to the wafers and a micromachine on one of the wafers.

It is still another object of this invention that such a method can be performed with relaxed alignment tolerances between the wafers.

It is yet another object of this invention that such a method can be readily performed within a vacuum.

In accordance with a preferred embodiment of this invention, these and other objects and advantages are accomplished as follows.

According to the present invention, there is provided a method by which semiconductor wafers can be solder bonded to form a semiconductor device, such as a sensor with a micromachined structure. Because the method of this invention is a solder bonding technique, the performance of the micromachine and other components of the device is not jeopardized by excessively high processing temperatures associated with other bonding techniques.

The solder bonding technique of this invention entails forming a solderable ring on the mating surface of a device wafer, such that the solderable ring circumscribes a micromachine on the wafer. A solderable layer is formed on a capping wafer, such that at least the mating surface of the capping wafer is entirely covered by the solderable layer. The mating surface of the capping wafer is limited to a peripheral surface region of the capping wafer, with the interior surface region being etched to provide a recess which forms a cavity with the device wafer when the device and capping wafers are bonded together. The step of forming the solderable layer can be performed by etching the mating surface of the capping wafer so as to form the recess, such that the recess is circumscribed by the mating surface, and then forming the solderable layer to cover the mating surface and the recess of the capping wafer. Alternatively, the solderable layer can be formed by depositing a solderable material to cover the entire lower surface of the capping wafer, patterning the resulting solderable layer to form an etch mask on the capping wafer that exposes an interior surface region of the capping wafer, and then etching the interior surface region to form the recess, such that the solderable layer covers the mating surface but not the surfaces of the recess.

Thereafter, a solder alloy is deposited on one or both of the solderable ring and layer. Suitable deposition methods include plating, screen printing, evaporation, sputtering, or a combination of these. The mating surfaces of the capping and device wafers are then mated such that the solder alloy is between the solderable ring and layer and the micromachine is enclosed in the cavity formed by the recess. The assembly is then heated to a temperature sufficient to reflow the solder alloy, and then cooled to solder bond the capping wafer to the device wafer. In the preferred embodiment, the solder alloy forms a hermetic seal between the capping and device wafers.

Using the bonding procedure of this invention, a sensor is manufactured at sufficiently low temperatures to avoid adversely affecting the micromachine as well as other temperature-sensitive structures and the device and capping wafers. In addition, the solder bond is able to form a hermetic seal over metal crossunders between the micromachine and the sensor bond pads, enabling the micromachine to be reliably enclosed in a vacuum. Finally, the method simplifies the process of aligning and mating the device and capping wafers by relaxing the alignment tolerances between the wafers as a result of the manner in which the solder layer on the capping wafer is formed. As a result, sensor yield can be substantially improved.

Other objects and advantages of this invention will be better appreciated from the following detailed description.

BRIEF DESCRIPTION OF THE DRAWINGS

The present invention will now be described, by way of example, with reference to the accompanying drawings, in which.

DETAILED DESCRIPTION OF THE INVENTION

Figure 1:
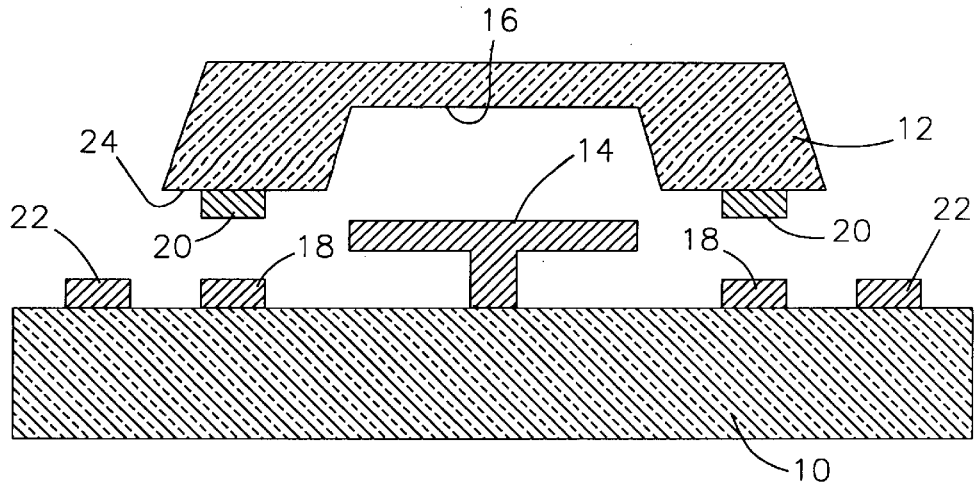
FIGS. 1 through 3 show exploded cross-sectional views of semiconductor sensing devices configured for bonding with solder in accordance with this invention.
Figure 2:
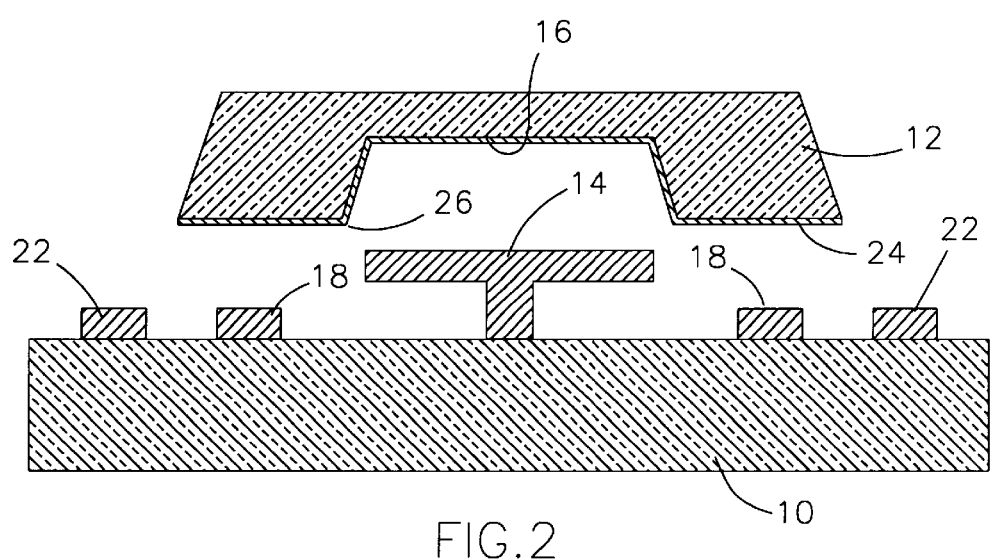
Figure 3:
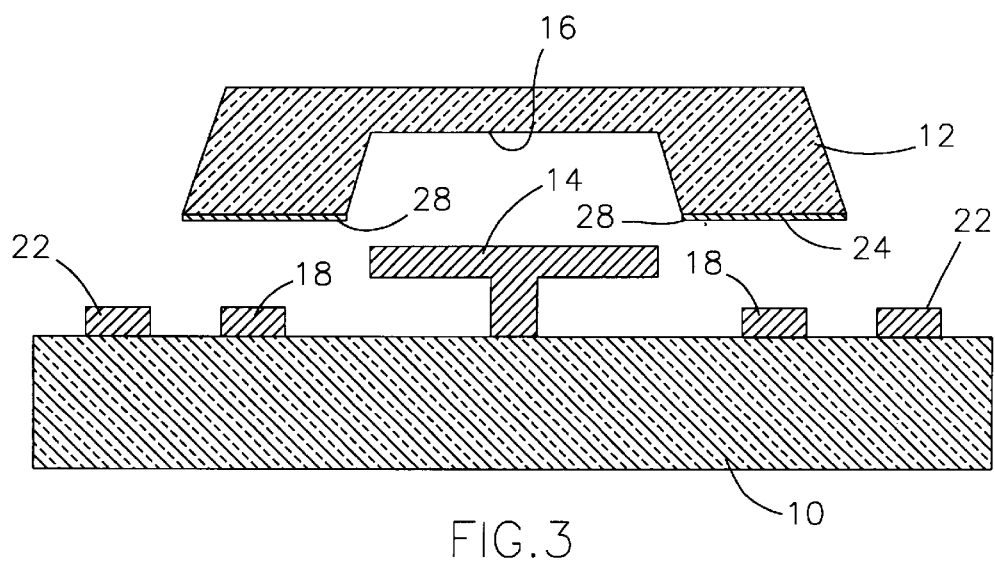

FIGS. 1 through 3 illustrate examples of semiconductor sensors that can be fabricated in accordance with the method of this invention. Each sensor is formed by bonding a device wafer 10 to a capping wafer 12, such that a micromachine 14 is enclosed within a cavity formed at least in part by a recess 16 in the capping wafer 12. The wafers 10 and 12 are preferably silicon, the device wafer 10 preferably monocrystallographic silicon, though it is foreseeable that other materials could be used. For example, the capping wafer 12 can be formed of glass, ceramic or another semiconducting material.

As illustrated in FIGS. 1 through 3, the micromachine 14 is a resonating micromachine of a type used to form yaw (angular rate) sensors and accelerometers, an example of which is disclosed in U.S. patent application Ser. No. 08/785,683 to Sparks et al. Other types of micromachines are also contemplated by this invention, including but not limited to micromachined cantilevers for sensing motion and diaphragms for sensing pressure. Conventionally, capacitive or piezoresistive sensing elements (not shown) are used to sense motion of the micromachine 14. As is conventional, the micromachine 14 is electrically interconnected to bond pads 22 on the device wafer 10 by conductive crossunders (not shown) that must cross beneath the mating surface 24 of the capping wafer 12. With the bond pads 22, the micromachine 14 and its corresponding sensing elements are electrically interconnected with appropriate signal conditioning circuitry that may be formed on the device wafer 10, the capping wafer 12 or a separate chip.

According to the invention, the micromachine 14 is hermetically sealed in a vacuum within the cavity by a solder bonding process that entails depositing a suitable solder composition on solderable regions of the device and capping wafers 10 and 12. The solderable regions are necessary as solder will not wet or metallurgical bond to the semiconductor substrates of the device and capping wafers 10 and 12. In FIG. 1, the solderable regions are configured as rings 18 and 20 on the device and capping wafers 10 and 12, respectively. In the embodiment of FIG. 1, relatively tight assembly tolerances are required to ensure accurate alignment of the rings 18 and 20.

The rings 18 and 20 shown in FIG. 1 necessarily require tight alignment tolerances to ensure that the rings 18 and 20 appropriately mate with the solder therebetween. Alignment tolerances are considerably relaxed with the embodiments of FIGS. 2 and 3, in which a solderable layer 26 or 28 is formed on the capping wafer 12 that permits a significant degree of misalignment with the device wafer 10 before any performance or processing problems are encountered. Advantageously, the solderable layers 26 and 28 are formed in a manner that simplifies and complements processing of the capping wafer 12, as will be explained in further detail below.

A suitable solderable metallization for the solderable rings 18 and 20 of FIG. 1 and the solderable layers 26 and 28 of FIGS. 2 and 3 contains three layers—an adhesion layer, and diffusion barrier layer and a solderable layer. The adhesion layer provides adhesion to the aluminum metallization (e.g., metal crossunders) and passivation (e.g., silicon dioxide or silicon nitride) on the wafers 10 and 12. Suitable materials for the adhesion layer include titanium, TiW, NiV, chromium and aluminum. The diffusion barrier layer is generally formed of a material such as nickel, NiV, CuCr, platinum or palladium, which exhibit very slow intermetallic formation rates to prevent solder dewetting. The solderable layer preferably reacts quickly with solder alloys to form a metallurgical bond during solder reflow. Suitable materials for the solderable layer include gold, silver, copper, nickel, NiV, palladium, platinum and SnPb. In order to preserve the solderability of the solderable layer, a thin layer of an oxidation barrier, such as gold, silver, platinum or an organic solderability preservative (OSP), can be deposited to cover the solderable layer. The combined thickness of the adhesion, diffusion barrier and solderable layers must be sufficient so that these layers do not to fully dissolve into the solder during reflow, which would reduce adhesion to the wafers 10 and 12 and preclude the formation of a hermetic seal. Suitable processes for depositing the layers of the solderable rings 18 and 20 and solderable layers 26 and 28 include screen printing, plating such as electroplating and electroless plating, sputtering, evaporation, and combinations of these techniques. The solderable rings 18 and 20 and solderable layers 26 and 28 can be formed by screen printing a single paste composition containing an organic vehicle and a metal powder of gold, silver, palladium, platinum, PdAg, and/or other alloy combinations.

On the capping wafer 12, the solderable ring 20 and solderable layers 26 and 28 can be deposited on a silicon oxide or nitride layer that serves as the silicon etch mask during etching of the recess 16. Anisotropic etchants such as EDP or alkali-type etchants such as potassium hydroxide (KOH) and tetramethyl ammonium hydroxide (TMAH) are used to etch completely through the wafer 12 to provide holes to the bond pads 22 on the device wafer 10.

In each of FIGS. 1 through 3, the recess 16 is etched in the capping wafer 12, as are the holes that will provide access to the bond pads 22 on the device wafer 10. As a result, the mating surface 24 of the capping wafer 12 circumscribes the recess 16 as shown. With reference to the embodiment of FIG. 1, the capping wafer 12 is etched after the solderable ring 20 is deposited and patterned. In contrast, the embodiment of FIG. 2 entails etching the capping wafer 12 first, after which the solderable layer 26 is deposited on both the mating surface 24 and the surfaces of the recess 16, such as by sputtering or evaporation, with the result that the solderable layer 26 covers essentially the entire lower surface of the capping wafer 12 as shown. Alternatively, FIG. 3 illustrates an embodiment in which the solderable layer 28 also serves as a silicon etch mask for the recess 16. In this process, the solderable layer 28 is deposited and then patterned to cover only a peripheral portion of the lower surface of the capping wafer 12, exposing an interior surface region of the capping wafer 12 where the recess 16 is to be formed and exposing an outer surface region where the silicon is to be etched to provide access to the bond pads 22 on the device wafer 10. Etching is then performed to define the recess 16 and the bond pad access, with the result shown in FIG. 3. With this embodiment, the solder alloy deposited on the solderable layer 28 to subsequently solder bond the device and capping wafers 10 and 12 will not flow into the recess 16 in the absence of the solderable layer 28 on the surfaces of the recess 16, such that a more controlled amount of solder can be provided on the mating surface 24 of the capping wafer 12.

Thereafter, a solder composition can be plated, evaporated, sputtered or screen printed (or a combination of these) on the solderable ring 20 or solderable layers 26 and 28 of the capping wafer 12, and optionally on the solderable ring 18 on the device wafer 10. Suitable solder alloys include PbSn, AgSn, AuSn, InSn, SbSn and other combinations of these and other solder alloys known in the art. These solder alloys flow at temperatures ranging from 180° C. to 300° C., though it is foreseeable that solders with lower and higher flow temperatures could be used. A preferred process is to plate a eutectic SnAg or Sn-8.5Sb solder alloy, the former having a melting temperature of about 221° C. while the latter has a solidus temperature of 240° C. and a liquidus temperature of 246° C. Tin can be plated first, followed by the remaining alloy constituent, to yield the desired alloy upon reflow while also preserving solderability prior to reflow.

If the solder composition is screen printed, a powder of the desired solder alloy is dispersed in an organic vehicle, with or without a flux, to form a paste having thixotropic properties, as is known in the art. The organic vehicle and flux are removed during heating of the paste, which is preferably performed in a vacuum or a reducing atmosphere to prevent oxidation of the solder alloy that remains. If a reducing atmosphere is used to flow the solder composition, the reducing gas must be pumped away from the wafers 10 and 12 before the bonding operation is completed in order to yield a vacuum within the cavity enclosing the micromachine 14. Heating the solder above its melting point can speed the elimination of the organic vehicle and flux, which is important for improving both the bond strength and vacuum quality of the bonded sensor assembly. Heating the device wafer 10 above about 100° C. in a vacuum is also useful in improving the vacuum level of the subsequently sealed micromachine 14 by removing volatile molecules from the surface of the device wafer 10 prior to bonding.

Wafer bonding is preferably accomplished in a vacuum system with the capability of keeping the wafers 10 and 12 aligned with each other while also initially keeping the wafers 10 and 12 apart during vacuum pump down. Once a suitable vacuum is pulled, the wafers 10 and 12 are mated using an applied force, and then heated to the melting/liquidus temperature of the solder alloy. When molten, the solder alloy wets only the solderable rings 18 and 20 and layers 26 and 28, and not the surrounding semiconductor surface regions of the wafers 10 and 12. Prior to cooling, the applied force is preferably removed to prevent solder cracking.

In view of the above, it can be appreciated that the solder bonding method of this invention can be employed to form various sensor devices with micromachined structures, such as yaw sensors, accelerometers, pressure sensors, RF MEMS, mechanical filters and SAW devices. In particular, the method can be used to improve the performance of resonating micromachines and tunneling devices by producing a highly reliable hermetic seal at relatively low bond temperatures, and is compatible with the fabrication of capacitive, piezoresistive and piezoelectric sensors.

Notably, the metal layers used to form the solderable ring 18 can be integrated into the design of the micromachine 14 to reduce the number of masks and layers employed, thereby reducing the cost of the device. One or more of the metals deposited to form the solderable ring 18 on the device wafer 10 can also be used to form the bond pads 22, metal runners, and a plating seed layer for electroformed micromachines. Similarly, bond pads and metal runners can be formed on the capping wafer 12 simultaneously with the solderable ring 20 and solderable layers 26 and 28.

Significant additional advantages of the embodiments of FIGS. 2 and 3 include the ability of the solderable layers 26 and 28 to serve as electromagnetic shields for their devices, protecting the micromachine 14 and its associated circuits from outside electromagnetic radiation. The solderable layers 26 and 28 can serve as grounding shields and can be electrically connected to the device wafer ground. Furthermore, the solder bonding method of FIGS. 2 and 3 can be used to reduce the size of a capped semiconductor sensor. As a result of the relaxed alignment tolerances enabled by the embodiments of FIGS. 2 and 3, the solderable ring 18 on the device wafer 10 can be made quite narrow, down to about five micrometers wide, which is considerably narrower than that required for glass frit and adhesive bonding, which typically require widths of 100 to 200 micrometers. The solderable layers 26 and 28 on the capping wafer 12 permit the width of the solderable ring 18 to be tailored to optimize bond strength or the reliability of the hermetic seal formed by the solder. Narrower widths for the solderable ring 18 are permitted if the seal is not required to be hermetic, as is the case where air damping is desired for piezoresistive, capacitive and piezoelectric accelerometers.

While the invention has been described in terms of a preferred embodiment, it is apparent that other forms could be adopted by one skilled in the art. Accordingly, the scope of the invention is to be limited only by the following claims.

What is claimed is:

1. A method for bonding a mating surface of a semiconductor capping wafer to a mating surface of a semiconductor device wafer so as to enclose therebetween a micromachine on the device wafer, the method comprising the steps of:

forming a solderable ring on the mating surface of the device wafer that circumscribes the micromachine on the device wafer;

forming a solderable layer on the capping wafer such that the mating surface of the capping wafer is entirely covered by the solderable layer;

depositing a solder alloy on at least one of the solderable ring and solderable layer;

mating the mating surfaces of the capping and device wafers such that the solder alloy is between the solderable ring and the solderable layer and such that the micromachine on the device wafer is received in a recess in the capping wafer;

heating the capping and device wafers to a temperature sufficient to reflow the solder alloy; and then cooling the capping and device wafers to solder bond the capping wafer to the device wafer.

2. A method as recited in claim 1, wherein at least one of the solderable ring and solderable layer comprises an adhesion layer, a diffusion barrier layer overlying the adhesion layer, and a solderable layer overlying the diffusion barrier layer.

3. A method as recited in claim 1, wherein bond pads are formed on the device wafer simultaneously with the solderable ring.

4. A method as recited in claim 1, wherein the solder alloy forms a hermetic seal between the capping and device wafers.

5. A method as recited in claim 1, wherein the heating step includes heating the capping and device wafers to a temperature of about 180° C. to about 300° C.

6. A method as recited in claim 1, wherein the solder alloy is deposited by at least one process chosen from the group consisting of plating, screen printing, evaporation and sputtering.

7. A method as recited in claim 1, wherein the mating surface of the capping wafer is limited to a peripheral surface region of the capping wafer.

8. A method as recited in claim 1, further comprising the steps of:

prior to forming the solderable layer, etching the mating surface of the capping wafer so as to form the recess and such that the recess is circumscribed by the mating surface; and then forming the solderable layer to cover the mating surface and the recess of the capping wafer.

9. A method as recited in claim 1, further comprising the steps of:

prior to forming the recess, forming the solderable layer to cover the entire mating surface of the capping wafer;

patterning the solderable layer on the mating surface of the capping wafer so as to form an etch mask on the capping wafer; and then etching the mating surface of the capping wafer so as to form the recess, such that the solderable layer covers the mating surface but not the recess.

10. A method of forming a resonating angular rate sensor by bonding a mating surface of a semiconductor capping wafer to a mating surface of a semiconductor device wafer so as to enclose therebetween a resonating angular rate micromachine on the device wafer, the method comprising the steps of:

forming a bond pad on the device wafer and a metal crossunder interconnecting the bond pad and the micromachine;

forming a solderable ring on the mating surface of the device wafer that circumscribes the micromachine on the device wafer;

etching the mating surface of the capping wafer so as to form a recess therein;

forming a solderable layer to cover the mating surface and the recess of the capping wafer;

depositing a solder alloy on at least one of the solderable ring and solderable layer;

mating the mating surfaces of the capping and device wafers such that the solder alloy is between the solderable ring and the solderable layer and such that the micromachine on the device wafer is received in the recess in the capping wafer;

heating the capping and device wafers in a vacuum to a temperature sufficient to reflow the solder alloy; and then cooling the capping and device wafers to solder bond the capping wafer to the device wafer, the solder alloy forming a hermetic seal between the capping and device wafers such that the micromachine is in a vacuum within the recess.

11. A method as recited in claim 10, wherein at least one of the solderable ring and solderable layer comprises an adhesion layer, a diffusion barrier layer overlying the adhesion layer, and a solderable layer overlying the diffusion barrier layer.

12. A method as recited in claim 10, wherein bond pads are formed simultaneously with the solderable ring on the device wafer.

13. A method as recited in claim 10, wherein the heating step includes heating the capping and device wafers to a temperature of about 180° C. to about 300° C.

14. A method of forming a resonating angular rate sensor by bonding a semiconductor capping wafer to a semiconductor device wafer so as to enclose therebetween a resonating angular rate micromachine on the device wafer, the method comprising the steps of:

forming a bond pad on the device wafer and a metal crossunder interconnecting the bond pad and the micromachine;

forming a solderable ring on the mating surface of the device wafer that circumscribes the micromachine on the device wafer;

forming a solderable layer on the capping wafer such that the mating surface of the capping wafer is entirely covered by the solderable layer;

patterning the solderable layer on the mating surface of the capping wafer so as to form an etch mask that circumscribes an interior surface region of the mating surface;

etching the interior surface region so as to form a recess, such that the solderable layer covers the mating surface but not the recess;

depositing a solder alloy on at least one of the solderable ring and solderable layer;

mating the mating surfaces of the capping and device wafers such that the solder alloy is between the solderable ring and the solderable layer and such that the micromachine on the device wafer is received in the recess in the capping wafer;

heating the capping and device wafers in a vacuum to a temperature sufficient to reflow the solder alloy; and then cooling the capping and device wafers to solder bond the capping wafer to the device wafer, the solder alloy forming a hermetic seal between the capping and device wafers such that the micromachine is in a vacuum within the recess.

15. A method as recited in claim 14, wherein at least one of the solderable ring and solderable layer comprises an adhesion layer, a diffusion barrier layer overlying the adhesion layer, and a solderable layer overlying the diffusion barrier layer.

16. A method as recited in claim 14, wherein bond pads are formed simultaneously with the solderable ring on the device wafer.

17. A method as recited in claim 14, wherein the heating step includes heating the capping and device wafers to a temperature of about 180° C. to about 300° C.

* * * * *